US012621950B2

(12) United States Patent
Tsorng et al.

(10) Patent No.: US 12,621,950 B2
(45) Date of Patent: May 5, 2026

(54) LOCKABLE COMPUTING DEVICE WITH MOVABLE LEVER

(71) Applicant: Quanta Computer Inc., Taoyuan City (TW)

(72) Inventors: Yaw-Tzorng Tsorng, Taoyuan City (TW); Ming-Lung Wang, Taoyuan City (TW); Hung-Wei Chen, Taoyuan City (TW); Yu-Cheng Chang, Taoyuan City (TW); Pei-Jung Hsieh, Taoyuan City (TW)

(73) Assignee: Quanta Computer Inc., Taoyuan City (TW)

( * ) Notice: Subject to any disclaimer, the term of this patent is extended or adjusted under 35 U.S.C. 154(b) by 276 days.

(21) Appl. No.: 18/497,438

(22) Filed: Oct. 30, 2023

(65) Prior Publication Data

US 2025/0040075 A1     Jan. 30, 2025

Related U.S. Application Data

(60) Provisional application No. 63/528,862, filed on Jul. 25, 2023.

(51) Int. Cl.
H05K 7/14          (2006.01)

(52) U.S. Cl.
CPC ......... H05K 7/1489 (2013.01); H05K 7/1402 (2013.01); H05K 7/1409 (2013.01); H05K 7/1411 (2013.01); H05K 7/1415 (2013.01)

(58) Field of Classification Search
CPC ........ G06F 1/1658; G06F 1/181; G06F 1/183; G06F 1/184; G06F 1/185; G06F 1/186; G06F 1/187; H05K 7/1401; H05K 7/1402; H05K 7/1405; H05K 7/1409; H05K 7/1411; H05K 7/1415; H05K 7/1417; H05K 7/1418; H05K 7/1422; H05K 7/1424; H05K 7/1427; H05K 7/1428; H05K 7/1429; H05K 7/1461; H05K 7/1487; H05K 7/1488; H05K 7/1489; H05K 7/16; G11B 33/022; G11B 33/08; G11B 33/12; G11B 33/128
USPC ...................................................... 361/679.33
See application file for complete search history.

(56) References Cited

U.S. PATENT DOCUMENTS

| | | | | |
|---|---|---|---|---|
| 4,472,763 A * | 9/1984 | Loris | .................... | H05K 7/1409 |
| | | | | 361/752 |
| 6,373,713 B1 * | 4/2002 | Jensen | ................. | H05K 7/1409 |
| | | | | 439/153 |
| 8,553,404 B2 * | 10/2013 | Lin | ...................... | G11B 33/128 |
| | | | | 361/679.33 |

(Continued)

*Primary Examiner* — Gage Crum
(74) *Attorney, Agent, or Firm* — NIXON PEABODY LLP

(57)          ABSTRACT

A computing device include a chassis, a mounting ear, a lever, and a locking unit. The chassis holds one or more electronic devices and is insertable into a rack, such as a server rack. The mounting ear is coupled to the chassis. The lever is rotatably coupled to the mounting ear and is rotatable between a first position and a second position. In the first position, the lever engages the rack to prevent the chassis from being removed. In the second position, the lever disengages the rack and allows the chassis to be removed. The locking unit is coupled to the mounting ear and transitions between locked and unlocked states. In the locked state, the locking unit secures the lever in the first position. In the unlocked state, the lever is movable from the first position to the second position.

16 Claims, 10 Drawing Sheets

(56)                References Cited

U.S. PATENT DOCUMENTS

| | | | | |
|---|---|---|---|---|
| 10,117,350 B2 * | 10/2018 | Kuang | H05K 7/1409 | |
| 10,939,573 B1 * | 3/2021 | Liao | H01R 13/62983 | |
| 11,489,274 B2 * | 11/2022 | Wang | H05K 7/1489 | |
| 11,558,976 B2 * | 1/2023 | Chang | H05K 7/1489 | |
| 11,665,840 B1 * | 5/2023 | O'Donnell | H05K 7/1409 | |
| | | | 361/801 | |
| 11,770,912 B2 * | 9/2023 | Mohanasundaram | | |
| | | | H05K 7/1492 | |
| | | | 361/725 | |
| 12,262,500 B1 * | 3/2025 | An | H05K 7/1489 | |
| 2007/0109760 A1 * | 5/2007 | Leung | H05K 7/1409 | |
| | | | 361/798 | |
| 2008/0266781 A1 * | 10/2008 | Olesiewicz | G11B 33/124 | |
| | | | 361/679.33 | |
| 2009/0279249 A1 * | 11/2009 | Crippen | G11B 33/124 | |
| | | | 361/679.58 | |
| 2012/0182671 A1 * | 7/2012 | Hou | H05K 7/1489 | |
| | | | 361/679.01 | |
| 2012/0236490 A1 * | 9/2012 | Xia | G06F 1/187 | |
| | | | 361/679.33 | |
| 2013/0130528 A1 * | 5/2013 | Jun | H05K 7/1409 | |
| | | | 439/160 | |
| 2014/0118972 A1 * | 5/2014 | Hoshino | H05K 7/1411 | |
| | | | 361/759 | |
| 2015/0063905 A1 * | 3/2015 | Wang | F16B 21/09 | |
| | | | 403/327 | |
| 2016/0150659 A1 * | 5/2016 | Chen | E05B 65/46 | |
| | | | 292/126 | |
| 2017/0329371 A1 * | 11/2017 | Schmidtke | G06F 1/20 | |
| 2018/0238360 A1 * | 8/2018 | Wang | H05K 7/1409 | |
| 2021/0198926 A1 * | 7/2021 | Tsorng | E05C 1/12 | |
| 2021/0270056 A1 * | 9/2021 | Tower | E05B 9/02 | |
| 2021/0364021 A1 * | 11/2021 | Lewis | H05K 7/1409 | |
| 2022/0349225 A1 * | 11/2022 | Yeh | E05B 1/0046 | |
| 2023/0099556 A1 * | 3/2023 | Sharfi | H05K 7/1409 | |
| | | | 361/679.58 | |
| 2024/0215192 A1 * | 6/2024 | Lee | H05K 7/1401 | |
| 2024/0237259 A9 * | 7/2024 | Lin | H05K 7/1489 | |

* cited by examiner

LOCKABLE COMPUTING DEVICE WITH MOVABLE LEVER

CROSS-REFERENCE TO RELATED APPLICATIONS

This application claims priority from and the benefit of U.S. Provisional Patent Application Ser. No. 63/528,862, filed on Jul. 25, 2023, titled "One-Piece Labor-Saving Structure Commonly Used in Various Server System for Mounting Ear and Lever," which is hereby incorporated by reference herein in its entirety.

FIELD OF THE INVENTION

The present disclosure relates generally to a computing device that can be inserted into a rack, and more specifically, to a computing device with a movable handle that can lock the computing device in a rack.

BACKGROUND OF THE INVENTION

Rack-mount computing devices (e.g., rack-mount server units) include chasses that can be inserted into a rack. These computing devices often include a lever structure that enables the chassis to be easily inserted into and removed from the rack, and can lock the chassis within the rack. However, these lever systems are often bulky and occupy space within and/or in the front of the chassis, and may reduce the number of electronic devices (e.g., hard disks, expansion cards, etc.) that can be placed on or in the chassis. Thus, new systems and devices are needed for mounting such computing devices within the rack.

SUMMARY OF THE INVENTION

The term embodiment and like terms, e.g., implementation, configuration, aspect, example, and option, are intended to refer broadly to all the subject matter of this disclosure and the claims below. Statements containing these terms should be understood not to limit the subject matter described herein or to limit the meaning or scope of the claims below. Embodiments of the present disclosure covered herein are defined by the claims below, not this summary. This summary is a high-level overview of various aspects of the disclosure and introduces some of the concepts that are further described in the Detailed Description section below. This summary is not intended to identify key or essential features of the claimed subject matter. This summary is also not intended to be used in isolation to determine the scope of the claimed subject matter. The subject matter should be understood by reference to appropriate portions of the entire specification of this disclosure, any or all drawings, and each claim.

In a first implementation, the present disclosure is directed to a computing device that includes a chassis, a mounting ear, a lever, and a locking unit. The chassis is configured to hold one or more electronic devices and is insertable into a rack. The mounting ear is coupled to the chassis. The lever is rotatably coupled to the mounting ear, and is rotatable between a first position and a second position. The lever is configured to engage the rack when in the first position and to disengage the rack when in the second position. The chassis is prevented from being removed from the rack when the lever is in the first position. The chassis is allowed to be removed from the rack when the lever is in the second position. The locking unit is coupled to the mounting ear and is configured to transition from a locked state to an unlocked state in response to a user force, and to automatically transition from the unlocked state to the locked state in response to the user force being removed. The lever is secured in the first position when the locking unit is in the locked state. The lever is movable from the first position to the second position when the locking unit is in the unlocked state.

In some aspects of the first implementation, the lever is rotatably coupled to the mounting ear via a mounting pin. The mounting pin extends through a mounting pin aperture in the lever and into a mounting pin aperture in the mounting ear. The lever is rotatable about the mounting pin between the first position and the second position.

In some aspects of the first implementation, the computing device further includes a torsion spring through which the mounting pin extends. The torsion spring biases the lever toward the second position.

In some aspects of the first implementation, the torsion spring includes a first leg contacting the mounting ear and a second leg contacting the lever. In the first position, the lever presses the second leg toward the first leg to compress the torsion spring.

In some aspects of the first implementation, in response to the lever being in the first position and the locking unit transitioning to the locked state, the torsion spring causes the lever to automatically move from the first position to the second position.

In some aspects of the first implementation, a first end of the mounting pin extends into the mounting pin aperture in the mounting ear and a second end of the mounting pin extends into a mounting pin aperture of the locking unit, such that the lever is further rotatably coupled to the locking unit.

In some aspects of the first implementation, the locking unit includes a housing coupled to the mounting ear, and a movable locking pin disposed at least partially within the housing. The locking pin is in a locked position when the locking unit is in the locked state, and is in an unlocked position when the locking unit is in the unlocked state.

In some aspects of the first implementation, the locking pin in the locked position extends into a locking pin aperture defined in the lever to secure the lever in the first position.

In some aspects of the first implementation, in response to the lever being in the first position and the locking pin moving to the unlocked position, the locking pin retracts at least partially into the housing and out of the locking pin aperture of the lever to allow the lever to move to the second position.

In some aspects of the first implementation, the locking unit further includes a baseplate coupled to the mounting ear. The locking pin is mounted within a locking pin aperture of the baseplate such that the locking pin is axially movable within the locking pin aperture of the baseplate between the locked position and the unlocked position.

In some aspects of the first implementation, the locking unit further includes a sliding member that is slidably coupled to the locking pin, the baseplate, or both. The sliding member has an angled surface that contacts a flared head of the locking pin when the locking unit transitions to the unlocked state. The contact between the angled surface and the flared head of the locking pin moves the locking pin from the locked position to the unlocked position.

In some aspects of the first implementation, the sliding member slides toward the locking pin to transition the locking unit from the locked state to the unlocked state.

In some aspects of the first implementation, the locking pin extends through a hollow interior of the sliding member. The angled surface of the sliding member is disposed adjacent to the flared head of the locking pin.

In some aspects of the first implementation, the locking unit includes a biasing spring through which the locking pin extends. The biasing spring biasing the locking pin toward the locked position.

In some aspects of the first implementation, the lever includes an angled surface formed about a periphery of the locking pin aperture of the lever. In response to the lever moving from the second position to the first position, contact between the angled surface of the lever and the locking pin causes the locking pin to move to the unlocked position.

In some aspects of the first implementation, the lever includes an angled surface formed about a periphery of the locking pin aperture of the lever. In response to the chassis being removed from the rack, contact between the angled surface of the lever and the locking pin causes the lever to rotate past the second position.

In a second implementation, the present disclosure is directed to a computing system that includes a rack, an attachment plate coupled to the rack, and a computing device. The computing device comprises a chassis, a mounting ear, a lever, and a locking unit. The chassis is configured to hold one or more electronic devices and is insertable into the rack. The mounting ear is coupled to the chassis. The lever is rotatably coupled to the mounting ear, and is rotatable between a first position and a second position. The lever engages the attachment plate when the lever is in the first position and disengages the attachment plate when the lever is in the second position. The chassis is prevented from being removed from the rack when the lever is in the first position. The chassis is allowed to be removed from the rack when the lever is in the second position. The locking unit is coupled to the mounting ear and is configured to transition from a locked state to an unlocked state in response to a user force, and to automatically transition from the unlocked state to the locked state in response to the user force being removed. The lever is secured in the first position when the locking unit is in the locked state. The lever is move from the first position to the second position when the locking unit is in the unlocked state.

In some aspects of the second implementation, the lever includes a hook formed at an end thereof. The hook extends through an opening in the attachment plate when the lever is in the first position to prevent the chassis from being removed from the rack.

In some aspects of the second implementation, the hook of the lever is removed from the opening in the attachment plate as the lever moves from the first position to the second position to allow the chassis to be removed from the rack.

In some aspects of the second implementation, the lever further includes a stopping tab formed at the end of the lever adjacent to the hook. The stopping tab contacts the attachment plate as the lever moves away from the first position to prevent further movement of the and to define the second position of the lever.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims. Additional aspects of the disclosure will be apparent to those of ordinary skill in the art in view of the detailed description of various embodiments, which is made with reference to the drawings, a brief description of which is provided below.

BRIEF DESCRIPTION OF THE DRAWINGS

The disclosure, and its advantages and drawings, will be better understood from the following description of representative embodiments together with reference to the accompanying drawings. These drawings depict only representative embodiments and are therefore not to be considered as limitations on the scope of the various embodiments or claims.

DETAILED DESCRIPTION

Figure 1:
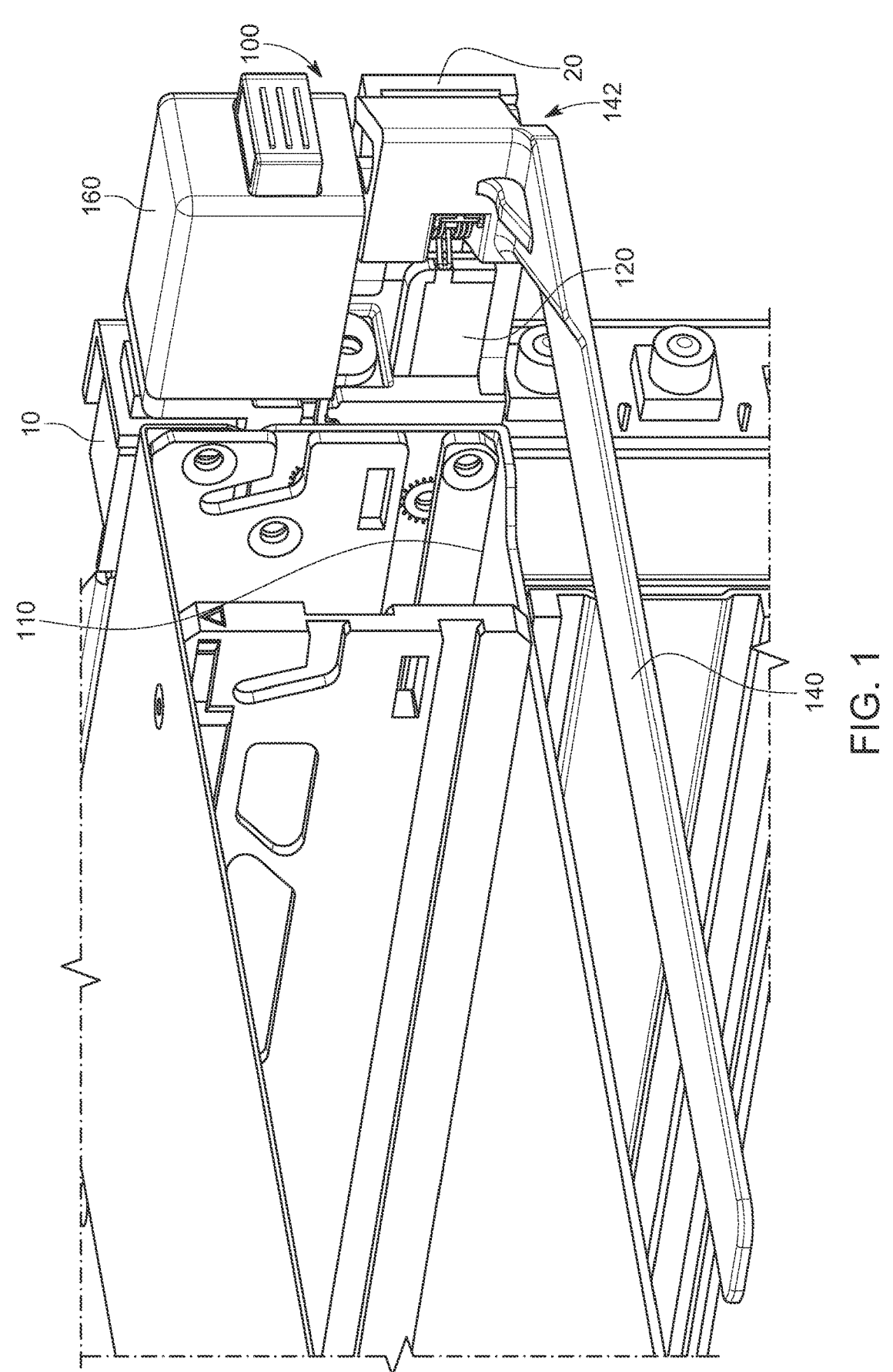
FIG. 1 is a perspective view of a computing device inserted into a rack, according to aspects of the present disclosure.

Various embodiments are described with reference to the attached figures, where like reference numerals are used throughout the figures to designate similar or equivalent elements. The figures are not necessarily drawn to scale and are provided merely to illustrate aspects and features of the present disclosure. Numerous specific details, relationships, and methods are set forth to provide a full understanding of certain aspects and features of the present disclosure, although one having ordinary skill in the relevant art will recognize that these aspects and features can be practiced without one or more of the specific details, with other relationships, or with other methods. In some instances, well-known structures or operations are not shown in detail for illustrative purposes. The various embodiments disclosed herein are not necessarily limited by the illustrated ordering of acts or events, as some acts may occur in different orders and/or concurrently with other acts or events. Furthermore, not all illustrated acts or events are necessarily required to implement certain aspects and features of the present disclosure.

For purposes of the present detailed description, unless specifically disclaimed, and where appropriate, the singular includes the plural and vice versa. The word "including" means "including without limitation." Moreover, words of approximation, such as "about," "almost," "substantially," "approximately," and the like, can be used herein to mean "at," "near," "nearly at," "within 3-5% of," "within acceptable manufacturing tolerances of," or any logical combination thereof. Similarly, terms "vertical" or "horizontal" are intended to additionally include "within 3-5% of" a vertical or horizontal orientation, respectively. Additionally, words of direction, such as "top," "bottom," "left," "right," "above," and "below" are intended to relate to the equivalent direction as depicted in a reference illustration; as understood contextually from the object(s) or element(s) being referenced, such as from a commonly used position for the object(s) or element(s); or as otherwise described herein.

FIG. 1 shows a rack 10 that holds a computing device 100. The rack 10 can be, for example, a server rack or other computing-related rack. The computing device 100 can include various electronic devices and/or components, including computing-related components. The computing device 100 may be a rack-mount server unit, or another rack-mount computing device or system. The computing device 100 includes a chassis 110 that can be inserted into the rack 10, for example by sliding the chassis 110 into and out of a corresponding slot in the rack 10. The computing device 100 includes a number of components that are used to lock the chassis 110 in the rack 10, and to allow for the chassis 110 to be easily inserted into and removed from rack 10. These components include a mounting ear 120, a lever 140, and a locking unit 160.

The mounting ear 120 is coupled to the rack 10, and both the lever 140 and the locking unit 160 are coupled to the mounting ear 120. In the illustrated implementation, the mounting ear 120 is fixedly coupled to the rack 10 such that the mounting ear 120 cannot move relative to the rack 10 (or can move very little relative to the rack 10), but in other implementations the mounting ear 120 may be movable coupled to the rack 10. Similarly, the locking unit 160 as a whole is generally fixedly coupled to the mounting ear 120 such that the locking unit 160 cannot move relative to the mounting ear 120 (or can move very little relative to the mounting ear 120). As discussed in more detail herein however, the locking unit 160 does include one or more individual components that move relative to the mounting ear 120, even though the locking unit 160 as a whole will generally not move relative to the mounting ear 120.

Figure 4A:
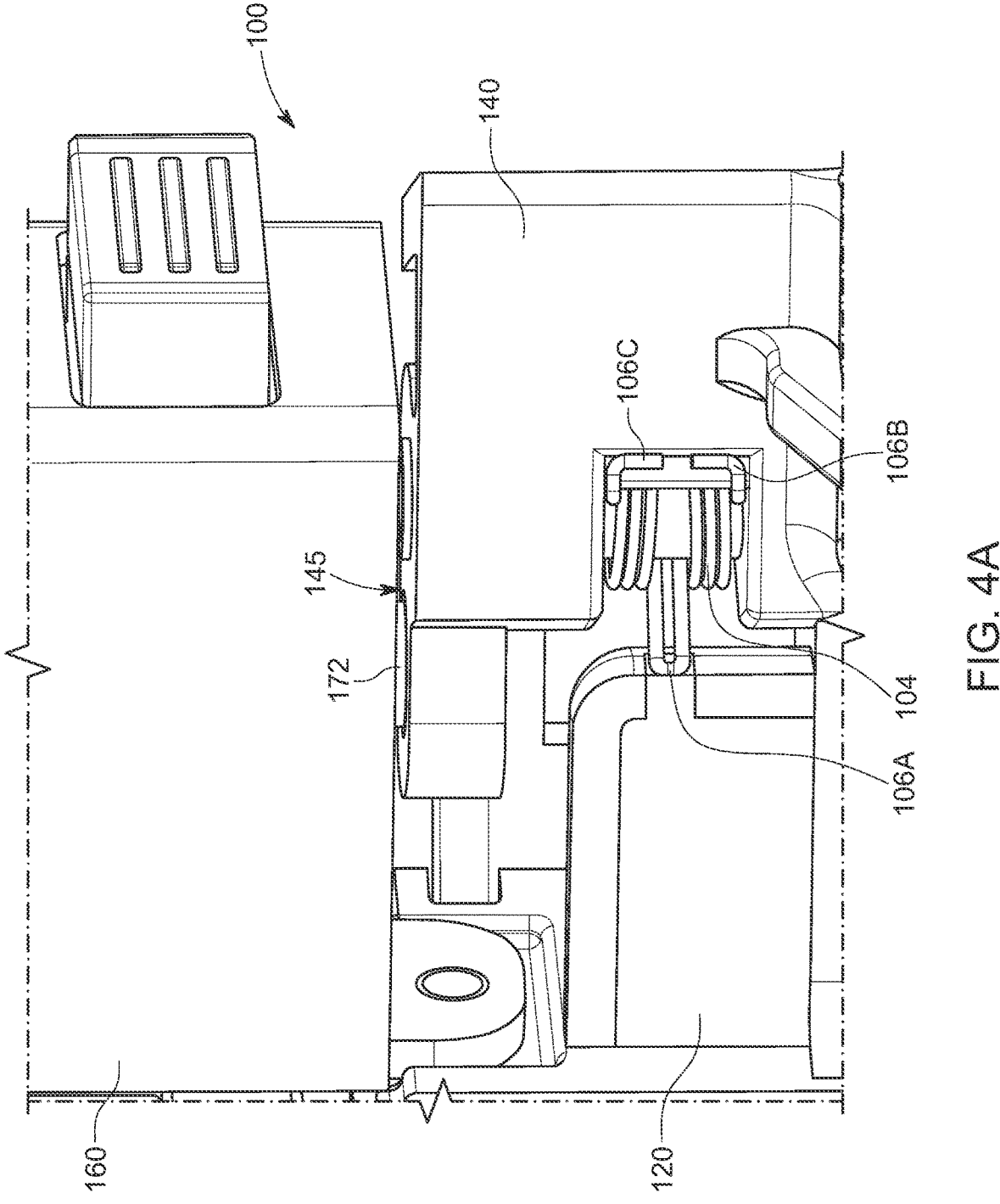
FIG. 4A is a zoomed-in perspective view of the computing device of FIG. 1 when the lever is in a first position, according to aspects of the present disclosure.
Figure 4B:
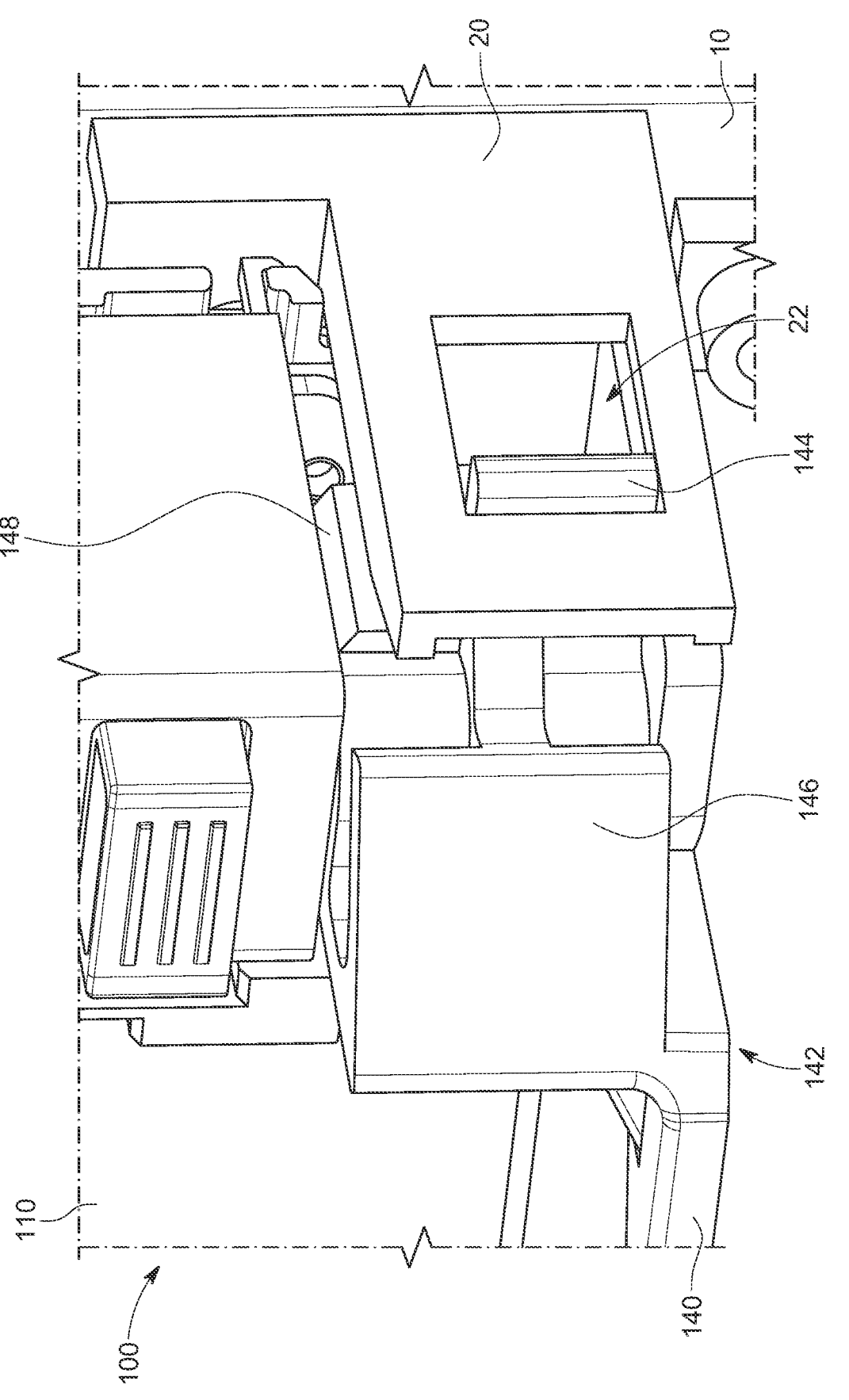
FIG. 4B is a perspective view of the lever engaging an attachment plate of the rack when the lever is in the first position, according to aspects of the present disclosure.
Figure 5A:
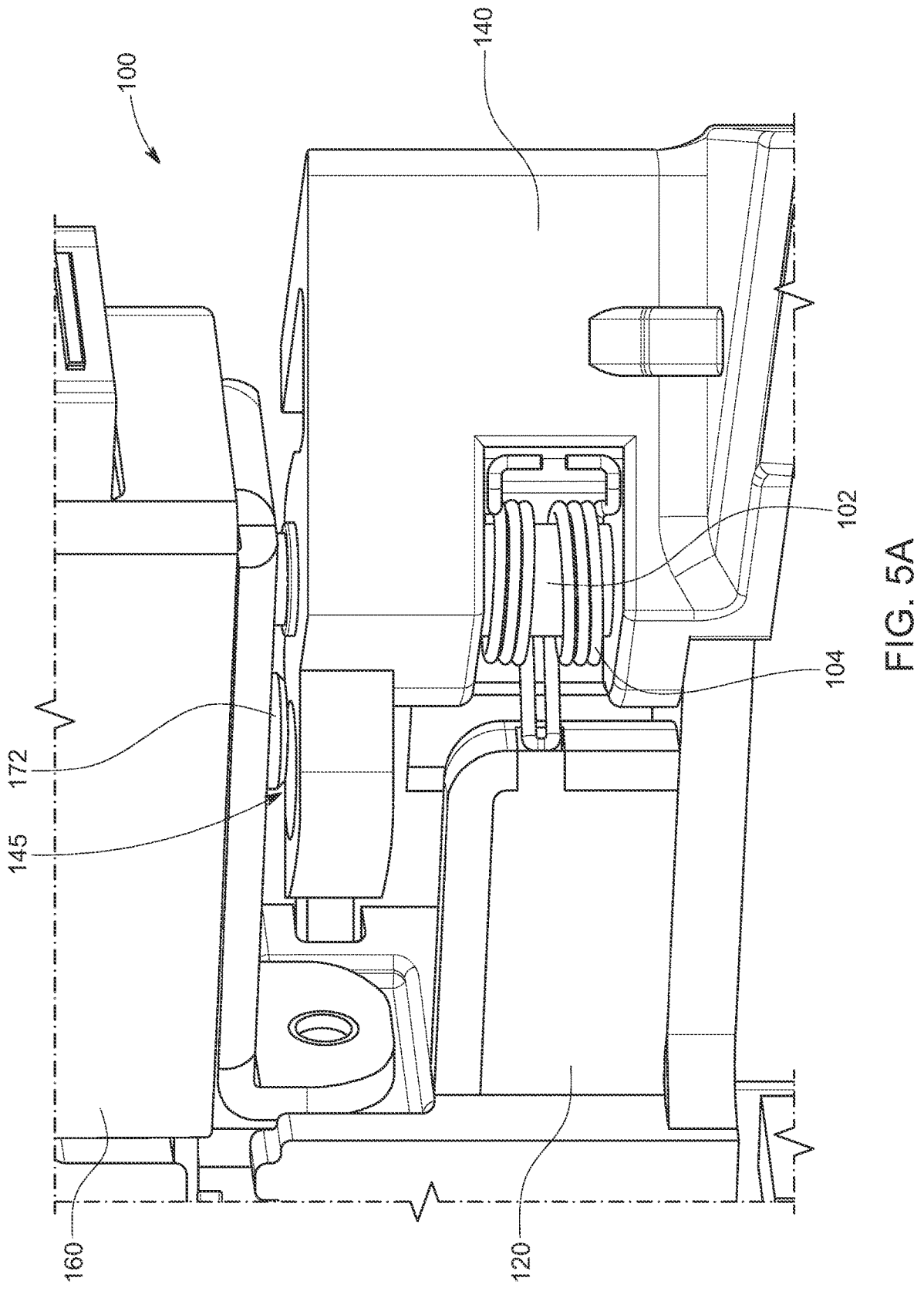
FIG. 5A is a zoomed-in perspective view of the computing device of FIG. 1 when the lever is in a second position, according to aspects of the present disclosure.
Figure 5B:
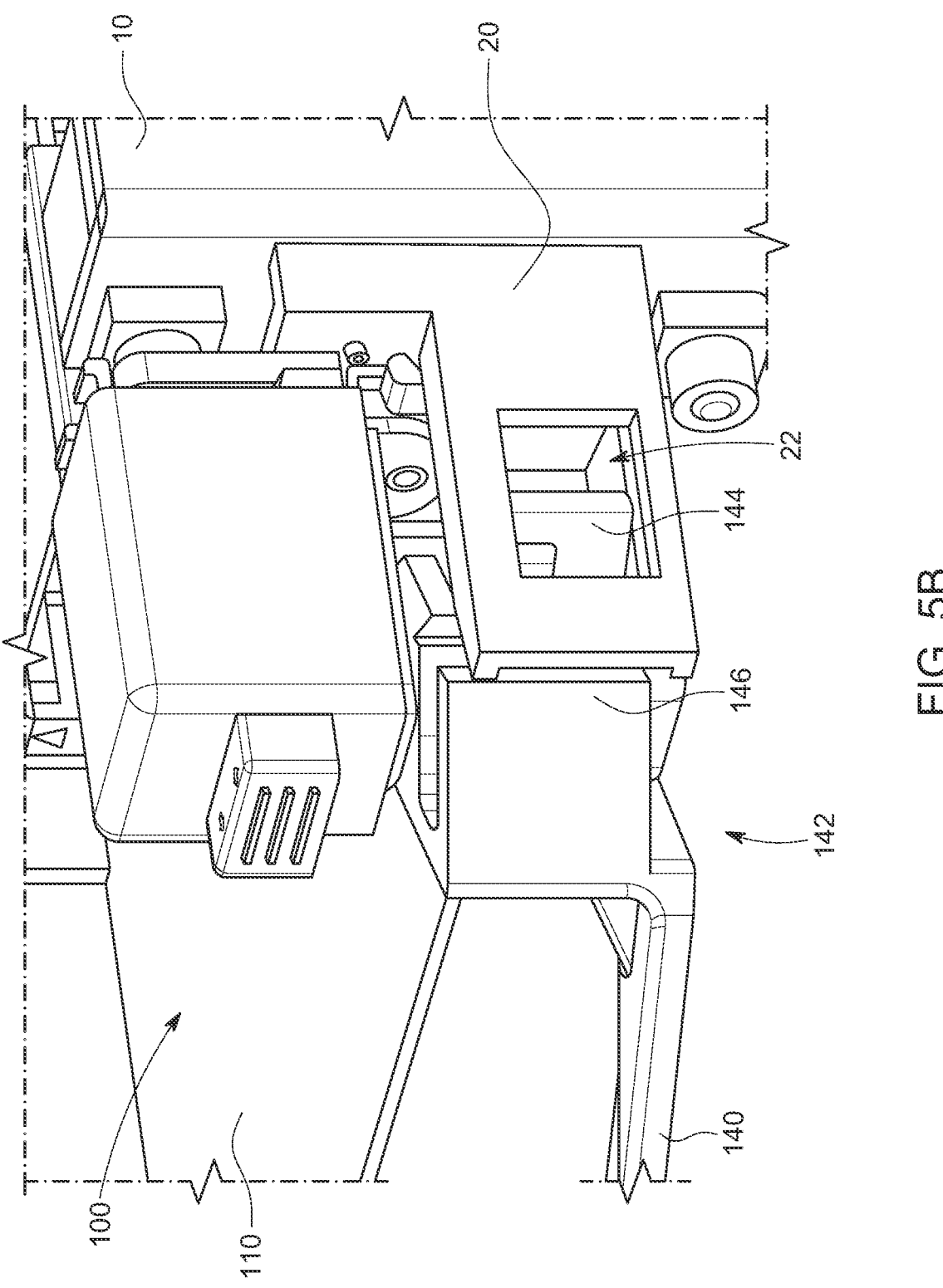
FIG. 5B is a perspective view of the lever disengaging the attachment plate of the rack when the lever is in the second position, according to aspects of the present disclosure.

The lever 140 is movably coupled to the mounting ear 120 and is movable between at least a first position (illustrated in FIGS. 4A, and 4B) and a second position (illustrated in FIGS. 5A and 5B). As discussed in more detail herein, when the lever 140 is in the first position, the lever 140 engages an attachment plate 20 that is coupled to the rack 10 to prevent the chassis 110 from being removed from the rack 10. When the lever 140 in the second position, the lever 140 disengages the attachment plate 20 to allow the chassis 110 to be removed from the rack 10. The lever 140 has a thin, flat profile along most of its length which allows a user or technician to easily grasp the lever 140 and move it between the first position and the second position (and/or to other positions). In the illustrated implementation, an end 142 of the lever 140 is rotatably coupled to the mounting ear 120, so that the lever 140 rotates between the first position and the second position.

In other implementations, however, the end 142 of the lever 140 (and/or additional or alternative portions of the lever 140) may be coupled to the mounting ear 120 in a different manner so that the lever 140 non-rotationally moves between the first position and the second position (and/or to other positions). In the illustrated implementation, the coupling between the end 142 of the lever 140 and the mounting ear 120 also couples the lever 140 to the locking unit 160 in the same manner. In other implementations, the lever 140 may only be coupled to the mounting ear 120. Further, while the illustrated implementation shows the lever 140 and the locking unit 160 coupled to the mounting ear 120 which is itself coupled to the chassis 110, in other implementations the lever 140 and/or the locking unit 160 can be coupled directly to the chassis 110. As is discussed in more detail herein, the locking unit 160 is movable between a locked state and unlocked state. When the locking unit 160 is in the locked state, the locking unit 160 secures the lever 140 in the first position. When the locking unit 160 is in the unlocked state, the lever 140 is movable from the first position to the second position.

Figure 2:
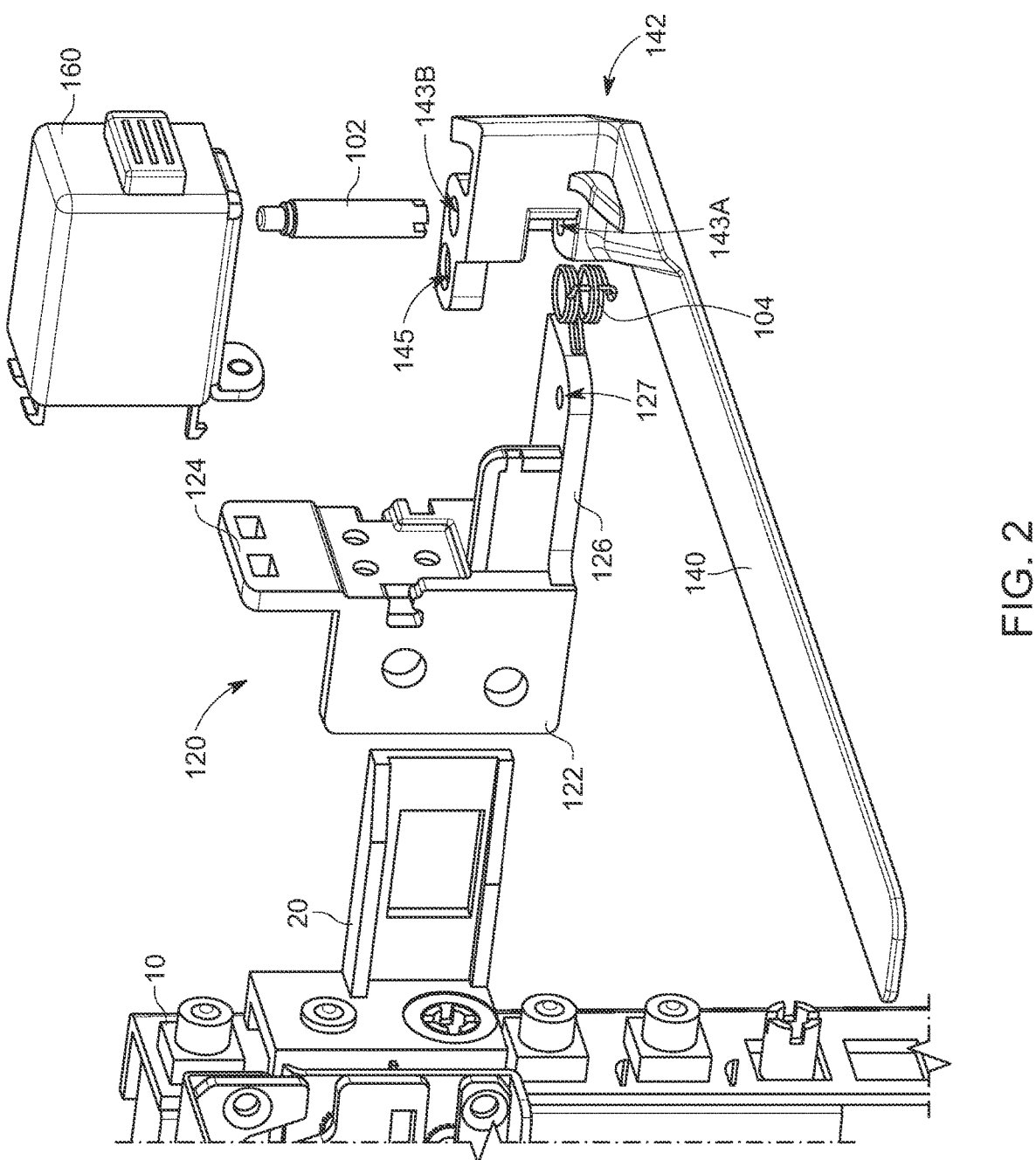
FIG. 2 is an exploded view of the computing device of FIG. 1, according to aspects of the present disclosure.

FIG. 2 is an exploded view of the computing device 100 showing the mounting ear 120, the lever 140, the locking unit 160, and the attachment plate 20. The mounting ear 120 is formed from a side portion 122, a front portion 124 extending perpendicular to the side portion 122, and a bottom portion 126 extending perpendicular to the side portion 122 and the front portion 124. The side portion 122 will be coupled to the interior of the rack 10 and includes one or more openings through which fasteners (e.g., bolts, screws, clips, etc.) can be inserted to couple the side portion 122 to the rack 10. The front portion 124 will be coupled to the locking unit 160, and includes one or more openings through which fasteners (e.g., bolts, screws, clips, etc.) can be inserted to couple the front portion 124 to the locking unit 160.

The computing device 100 includes a mounting pin 102 that is used to couple the lever 140 to the mounting ear 120 and/or to the locking unit 160. The lever 140 includes a mounting pin aperture 143A and a mounting pin aperture 143B, and the bottom portion 126 of the mounting ear 120 includes a mounting pin aperture 127. The mounting pin 102 extends through the mounting pin aperture 143A, and at least into the mounting pin aperture 143B and the mounting pin aperture 127 of the bottom portion 126, to thereby couple the lever 140 to the mounting ear 120. The lever 140 can thus rotate about the mounting pin 102 to move between the first position and the second position. In the illustrated implementation, the mounting pin 102 extends all the way through the mounting pin aperture 143B and into a mounting pin aperture 166 (FIG. 3A) of the locking unit 160, to further couple the lever 140 to the locking unit 160. The computing device 100 also includes a torsion spring 104 that is used to bias the lever 140 to the second position. The torsion spring 104 is positioned between a lower part of the end 142 where the mounting pin aperture 143A is defined, and an upper part of the end 142 where the mounting pin aperture 143B is defined. When the lever 140 is coupled to the mounting ear 120, the mounting pin 102 extends through the torsion spring 104. FIG. 2 also shows a locking pin aperture 145 defined in the upper part of the end 142 of the lever 140, adjacent to the mounting pin aperture 143B. The locking unit 160 is configured to engage the locking pin aperture 145 to secure the lever 140 in the first position, as discussed in more detail herein.

Figure 3A:
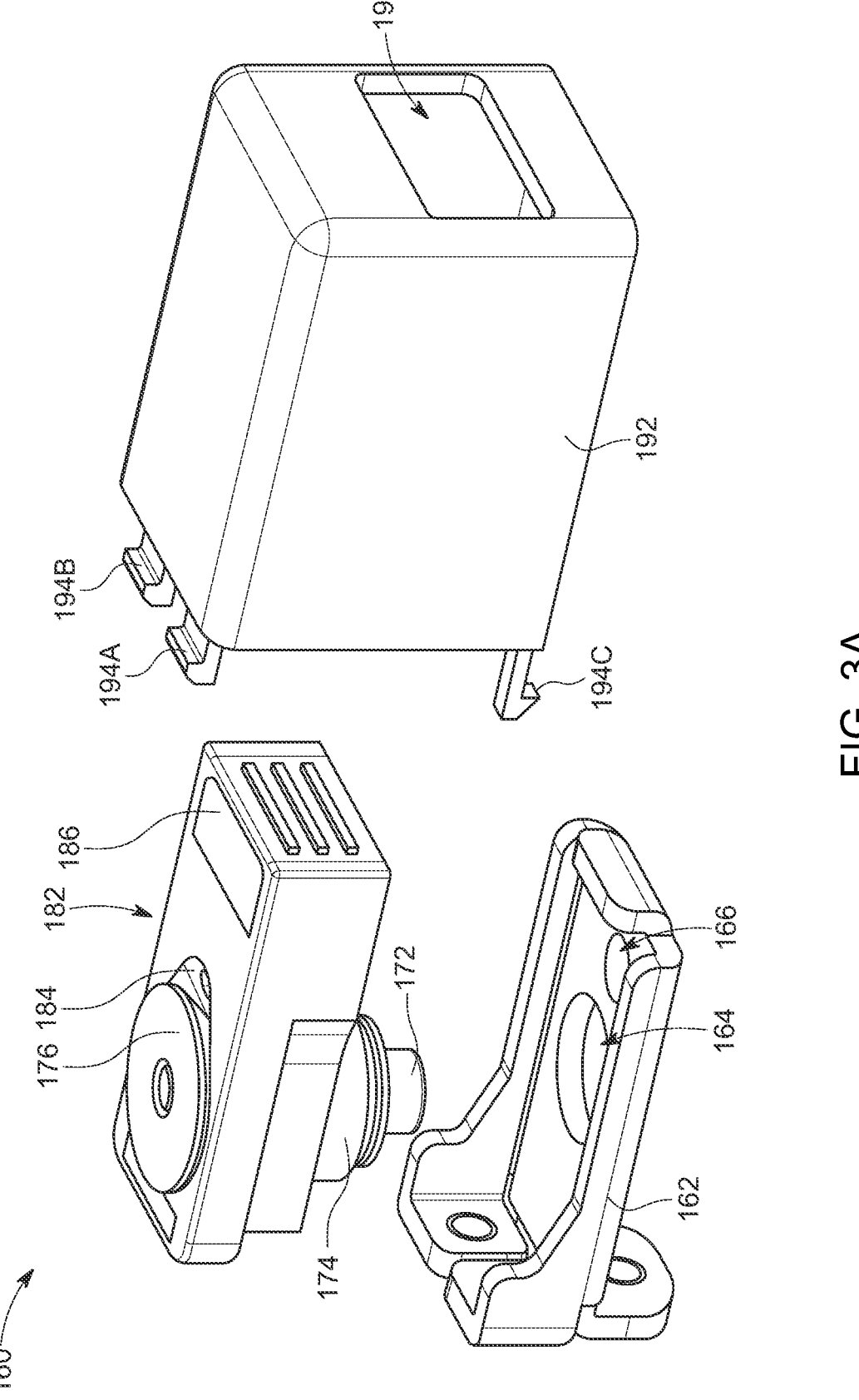
FIG. 3A is an exploded view of a locking unit of the computing device of FIG. 1, according to aspects of the present disclosure.

FIG. 3A is an exploded view of the locking unit 160, which includes a baseplate 162, a locking pin 172, a sliding member 182, and a housing 192. When the locking unit 160 is assembled, the baseplate 162 is coupled to the mounting ear 120. The baseplate 162 includes apertures defined therein that align with corresponding apertures in the mounting ear 120. Fasteners can be inserted through the apertures to couple the baseplate 162 to the mounting ear 120. The baseplate 162 includes a locking pin aperture 164 that receives the locking pin 172, and the mounting pin aperture 166 that receives the mounting pin 102. When the locking unit 160 is in the locked position, the locking pin 172 is in a locked position and is received within the locking pin aperture 145 (FIG. 2) of the lever 140, and when the locking unit 160 is in the unlocked position, the locking pin 172 is in an unlocked position and is retracted out of the locking pin aperture 145 of the lever 140.

The locking pin 172 includes a mounting flange 174 extending about the periphery of the locking pin 172, and a flared head 176. When the locking unit 160 is assembled, the mounting flange 174 is mounted within the locking pin aperture 164 of the baseplate 162. The mounting flange 174 has a diameter that is less than the diameter of the locking pin aperture 164. In some implementations, the diameter of the mounting flange 174 is just slightly less than the diameter of the locking pin aperture 164, and is retained in the locking pin aperture 164 via a friction fit between the mounting flange 174 and the portion of the baseplate 162 forming the periphery of the locking pin aperture 164. The mounting flange 174 is not fixedly coupled to the locking pin 172. Thus, when the mounting flange 174 is positioned within the locking pin aperture 164, that the locking pin 172 is movable in an axial direction relative to the mounting flange 174 and the locking pin aperture 164, to move between the locked position and the unlocked position.

When the locking unit 160 is assembled and in the locked state, the sliding member 182 rests on the baseplate 162 with the locking pin 172 extending through a hollow interior of the sliding member 182. When the locking pin 172 is in the locked position, the end of the locking pin 172 extends through the locking pin aperture 164 of the baseplate 162 and into the locking pin aperture 145 of the lever 140. The sliding member 182 has an angled surface 184 that is positioned adjacent to the flared head 176 of the locking pin 172. Because the locking pin 172 is coupled to the baseplate 162 (via the mounting flange 174 being positioned within the locking pin aperture 164) and the sliding member 182 is not, the sliding member 182 can slide relative to the flared head 176. The sliding member 182 is slid toward the flared head 176 to move the locking unit 160 to the unlocked state. As the sliding member 182 is slid toward the flared head 176, contact between the flared head 176 and the angled surface 184 lifts up the locking pin 172 to move it away from the baseplate 162. As this movement occurs, the locking pin 172 is moved to the unlocked position and removed from the locking pin aperture 145 of the lever 140 to unlock the lever 140 and allow the lever 140 to move to the second position.

The housing 192 can be coupled to the mounting ear 120 via tabs 194A, 194B, and 194C that are inserted through corresponding apertures in the mounting ear 120. The housing 192 may include a fourth tab opposite from the tab 194C that is not visible in FIG. 3A. When the housing 192 is coupled to the mounting ear 120, the housing 192 covers up all or part of the baseplate 162, the locking pin 172, and the sliding member 182 such that those components are not externally accessible. However, the housing 192 does include a window 196 defined therein through which an end 186 of the sliding member 182 is accessible. A user or technician can contact the end 186 of the sliding member

182 through the window 196 to slide the sliding member 182 toward the flared head 176 of the locking pin 172.

Figure 3B:
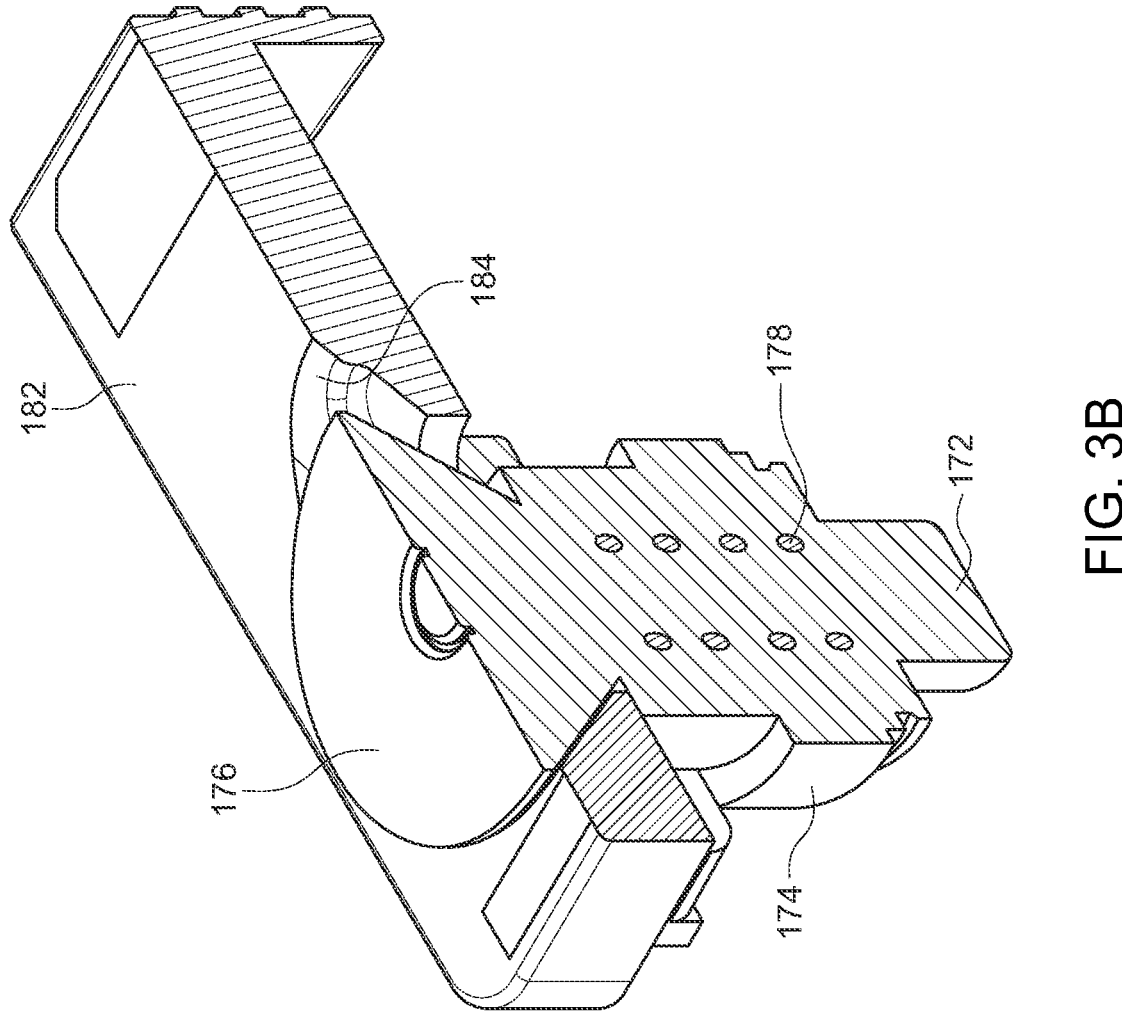
FIG. 3B is a cross-sectional view of a locking pin and sliding member of the locking unit of FIG. 3A, according to aspects of the present disclosure.

FIG. 3B is a cross-sectional view of the locking pin 172 and the sliding member 182. As shown, the locking pin 172 can extend through a spring 178 that is positioned within the mounting flange 174. When the locking unit 160 moves to the unlocked state and the locking pin 172 is raised upward by the angled surface 184 to the unlocked position, the spring 178 is compressed between an internal upper edge of the mounting flange 174 and a lower external edge of the locking pin 172. When the force sliding the sliding member 182 toward the flared head 176 is removed, the spring 178 will expand and force the locking pin 172 to move downward back toward the locked position. As such, the locking unit 160 moves from the locked state to the unlocked state in response to a user force being applied (e.g., in response to the user pressing the end 186 of the sliding member 182 through the window 196 of the housing 192), and automatically moves from the unlocked state to the locked state in response to the user force being removed, due to the biasing from the spring 178.

FIG. 4A shows a zoomed-in perspective view of the computing device 100 when the locking unit 160 is in the locked state and locks the lever 140 in the first position. The locking pin 172 is in the locked position and extends into the locking pin aperture 145 of the lever 140. Because the locking pin 172 is fixedly mounted within the locking unit 160, the locking pin 172 locks the lever 140 in the first position. When the lever 140 is in the first position, the torsion spring 104 is compressed between the mounting ear 120 and the lever 140. In the illustrated implementation, the torsion spring 104 includes a first leg 106A that contacts the mounting ear 120, a second leg 106B that contacts the lever 140, and a third leg 106C that also contacts the lever 140. When the lever 140 is in the first position, the lever 140 presses the second leg 106B and the third leg 106C toward the first leg 106A to compress the torsion spring 104. The compression of the torsion spring 104 causes the torsion spring 104 to exert a torque that biases the lever 140 away from the first position (e.g., toward the second position). In other implementations, the torsion spring 104 may have different designs. For example, the torsion spring 104 could include only the first leg 106A and the second leg 106B. In this implementation, the lever 140 in the first position presses the second leg 106B toward the first leg 106A to compression the torsion spring 104.

FIG. 4B is a view of the opposite side of the computing device 100, illustrating the engagement between the lever 140 and the attachment plate 20 when the lever 140 is in the first position. As shown, the lever 140 includes a hook 144, a stopping tab 146, and an angled surface 148 that are all formed at the end 142. When the lever 140 is in the first position, the hook 144 extends through an opening 22 in the attachment plate 20 and at least partially hooks the portion of the attachment plate 20 forming a part of the edge of the opening 22. Because the lever 140 is coupled to the chassis 110, the engagement between the hook 144 and the attachment plate 20 prevents the chassis 110 from being removed from the rack 10, as the lever 140 cannot move away from the rack 10 and the attachment plate 20. The stopping tab 146 prevents the lever 140 from moving past the second position when the chassis 110 is still inserted in the rack 10, as discussed in more detail herein. The angled surface 148 aids in causing the lever 140 to move past the second position when the chassis 110 is removed from the rack 10, as discussed in more detail herein.

FIG. 5A shows a zoomed-in perspective view of the computing device 100 when the locking unit 160 is in the unlocked state and the lever 140 has moved to the second position. The locking pin 172 has moved to the unlocked position and is retracted out of the locking pin aperture 145, such that the lever 140 is allowed to rotate out of the first position. When the locking pin 172 moves to the unlocked position and retracts out of the locking pin aperture 145, the torque exerted by the torsion spring 104 due to the compression of the torsion spring 104 between the mounting ear 120 and the lever 140 causes the lever 140 to rotate about the mounting pin 102 toward the second position.

FIG. 5B is a view of the opposite side of the computing device 100, illustrating the lever 140 disengaging from the attachment plate 20 when the lever 140 is in the second position. The hook 144 of the lever 140 has rotated out of the opening 22 of the attachment plate 20 such that the hook 144 no longer prevents the chassis 110 from being removed from the rack 10. As the lever 140 rotates to the second position, the stopping tab 146 moves toward and contacts the attachment plate 20. The contact between the stopping tab 146 and the attachment plate 20 prevents any further movement of the lever 140 away from the first position when the chassis 110 is still positioned within the rack 10.

In some implementations, the second position of the lever 140 is any position of the lever 140 where the hook 144 no longer extends through the opening 22 in the attachment plate 20 to prevent removal of the chassis 110. In these implementations, the second position of the lever 140 can generally encompass multiple different physical positions of the lever 140, as long as the hook 144 in each of these positions does not extend through the opening 22. In other implementations, the second position of the lever 140 is the resting position of the lever 140 when the stopping tab 146 contacts the attachment plate 20 and prevents further rotation of the lever 140. In any implementation, the torsion spring 104 (FIGS. 4A and 5A) coupled be compressed slightly or relaxed when the lever 140 is in the second position.

Figure 6:
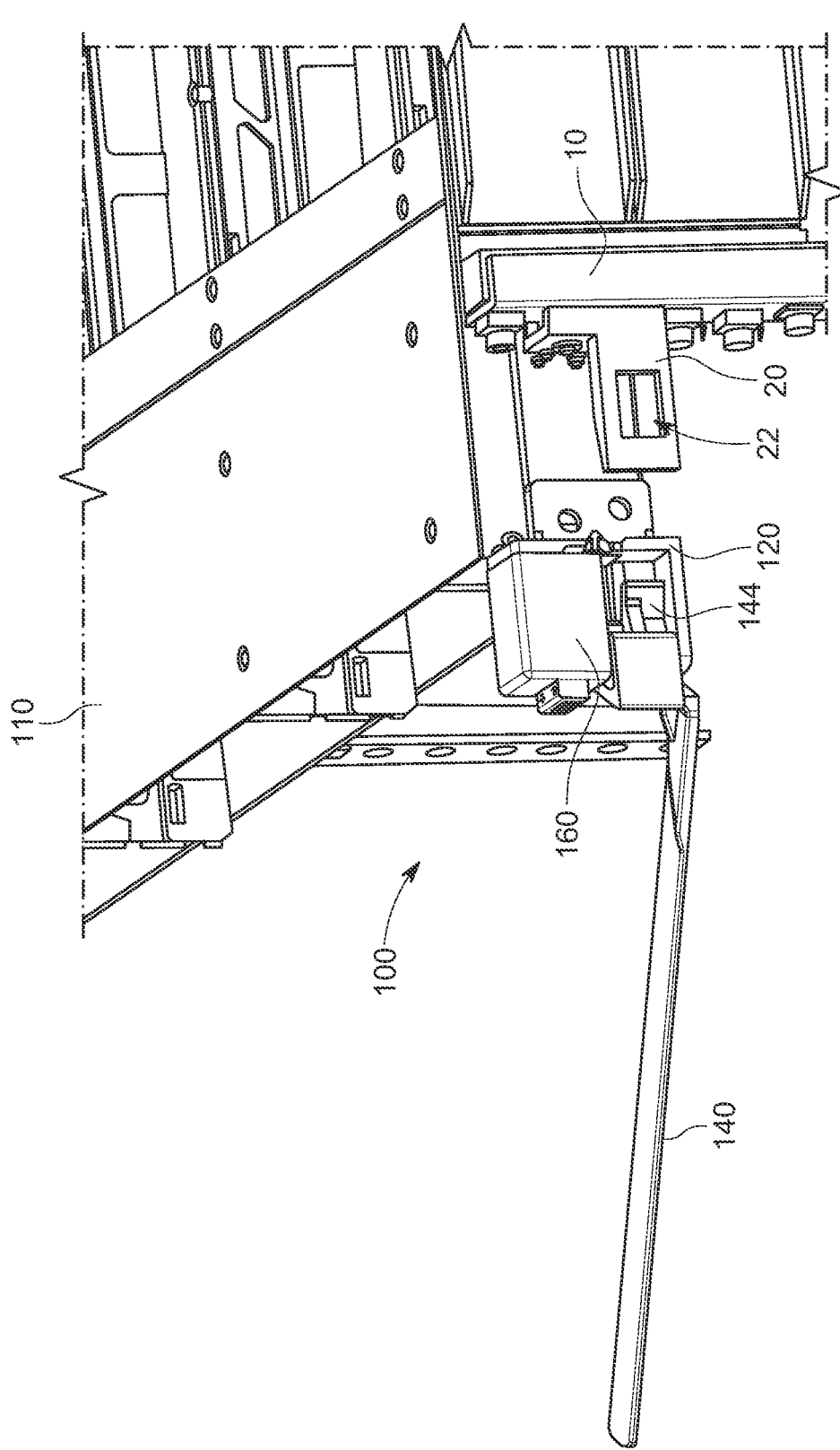
FIG. 6 is a perspective view of the computing device of FIG. 1 being removed from the rack, according to aspects of the present disclosure.

FIG. 6 shows the computing device 100 when the chassis 110 has been removed from the rack 10. Because the hook 144 of the lever 140 is no longer positioned within the opening 22 of the attachment plate 20, the hook 144 does not prevent the chassis 110 from being removed. As shown, the attachment plate 20 is couple to the rack 10 and thus does not move, whereas the mounting ear 120, the lever 140, and the locking unit 160 are all coupled to the chassis 110 and move with the chassis 110.

Figure 7:
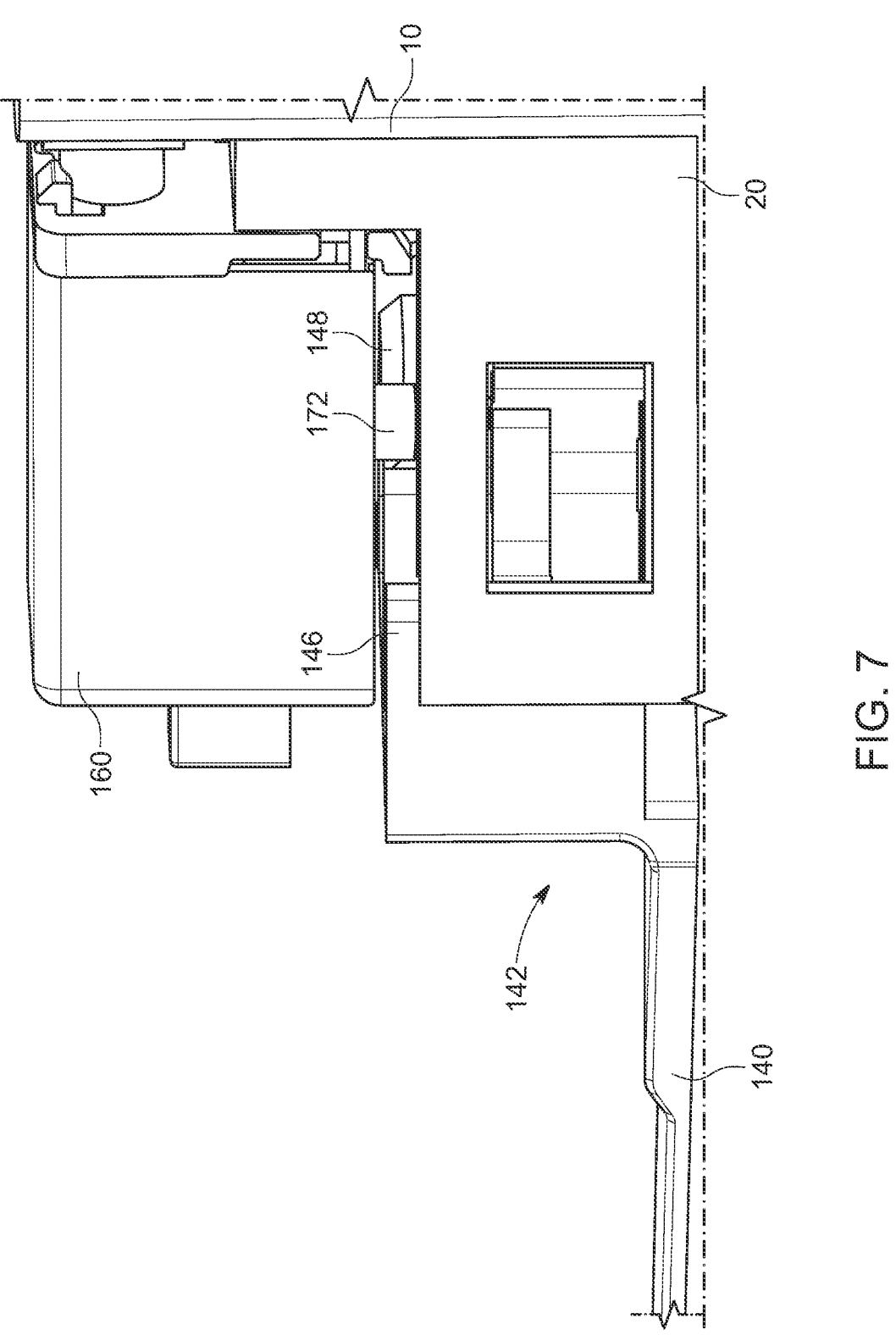
FIG. 7 is a perspective view of the locking pin of the locking unit showing an angled surface of the lever that contacts the locking pin of the locking unit, according to aspects of the present disclosure.

Referring now to FIG. 7, the angled surface 148 formed at the end 142 of the lever 140 can interact with the locking pin 172 as the chassis 110 is inserted into and removed from the rack 10. The angled surface 148 is located around at least a portion of the periphery of the locking pin aperture 145 (FIG. 2). As the locking unit 160 moves to the unlocked state, the locking pin 172 retracts out of the locking pin aperture 145 to the unlocked position, and the lever 140 is automatically moved to the second position (for example due to the torque exerted by the torsion spring 104 when compressed between the mounting ear 120 and the lever 140). Because the locking unit 160 is biased toward the locked state (e.g., toward the extended position), the locking pin 172 will automatically move back toward the lever 140 (e.g., back toward the locked position) once the user force moving the locking unit 160 to the unlocked state is removed. However, because the lever 140 has moved to the second position, the locking pin 172 contacts the angled surface 148 instead of extending back into the locking pin aperture 145. The angled surface 148 will stop the locking pin 172 from extending all the way back to the locked position when the locking unit 160 is in the locked state.

When the chassis 110 is removed from the rack 10, the lever 140 moves away from the attachment plate 20 so that the contact between the attachment plate 20 and the stopping tab 146 of the lever 140 no longer prevents the lever 140 from rotating past the second position. The bias of the locking unit 160 causes the locking pin 172 to exert a downward force on the angled surface 148, which in turn pushes the lever 140 to rotate past the second position. As shown in FIG. 7, when the lever 140 has rotated past the second position and the locking pin 172 fully moves to the locked position, the end of the locking pin 172 is lower than the angled surface 148. In some implementations, the torsion spring 104 can continue to exert a torque on the lever 140 to also aid in causing the lever 140 to rotate past the second position.

In some implementations, the angled surface 148 of the lever 140 and the locking pin 172 contact each other when the chassis 110 is inserted into the rack 10. In these implementations, the locking unit 160 may be moved to the unlocked state and the chassis 110 may then be inserted into the rack 10 with the lever 140 in the second position. Once the user force moving the locking unit 160 to the unlocked state is removed, the locking pin 172 will extend back to the locked position and contact the angled surface 148. As the lever 140 is moved from the second position to the first position, the contact between the angled surface 148 and the locking pin 172 will lift up the locking pin 172 until the locking pin 172 is aligned with the locking pin aperture 145, at which point the locking pin 172 will move back into the locking pin aperture 145 to secure the lever 140 in the second position.

Although the disclosed embodiments have illustrated and described with respect to one or more implementations, equivalent alterations and modifications will occur or be known to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

While various embodiments of the present disclosure have been described been above, it should be understood that they have been presented by way of example only, and not limitation. Numerous changes to the disclosed embodiments can be made in accordance with the disclosure herein, without departing from the spirit or scope of the disclosure. Thus, the breadth and scope of the present disclosure should not be limited by any of the above-described embodiments. Rather, the scope of the disclosure should be defined in accordance with the following claims and their equivalents.

What is claimed is:

1. A computing device, the computing device comprising:
a chassis configured to hold one or more electronic devices, the chassis being insertable into a rack;
a mounting ear coupled to the chassis;
a lever rotatably coupled to the mounting ear, the lever being rotatable between a first position and a second position, the lever configured to engage the rack when in the first position and to disengage the rack when in the second position, the chassis being prevented from being removed from the rack when the lever is in the first position, the chassis being allowed to be removed from the rack when the lever is in the second position;

a locking unit coupled to and positioned above the mounting ear, the locking unit transitioning from a locked state to an unlocked state in response to a user force and automatically transitioning from the unlocked state to the locked state in response to the user force being removed, the lever being secured in the first position when the locking unit is in the locked state, the lever being movable from the first position to the second position when the locking unit is in the unlocked state, the locking unit including a housing coupled to the mounting ear and including a window for internal accessibility, a locking pin having a flared head at one end, the locking pin being movable and disposed at least partially within the housing, the locking pin being in a locked position when the locking unit is in the locked state and in an unlocked position when the locking unit is in the unlocked state, a mounting flange extending about a periphery of the locking pin, a sliding member that is slidably coupled to the locking pin, the locking pin passing completely through a hole of the sliding member, the flared head extending from one end of the sliding member, the locking pin extending from an opposite end of the sliding member, the sliding member having an angled surface that contacts the flared head of the locking pin when the locking unit transitions to the unlocked state, the flared head protruding through the sliding member, the contact between the angled surface and the flared head moving the locking pin from the locked position to the unlocked position, the sliding member further having an end that is accessible to a user through the window of the housing, contact of the user with the sliding member causing the sliding member to slide toward the flared head of the locking pin, and a baseplate mounted with the locking pin, the sliding member being slidably fixed between the locking pin and the baseplate, the baseplate being insertable and positioned between the sliding member and a bottom surface of the housing; and a mounting pin via which the lever is rotatably coupled to the mounting ear, the mounting pin extending through a first mounting pin aperture in the lever and into a second mounting pin aperture in the mounting ear, the lever being rotatable about the mounting pin between the first position and the second position, the mounting pin having a first end that extends into the second mounting pin aperture in the mounting ear, the mounting pin further having a second end that extends into a third mounting pin aperture of the locking unit such that the lever is further rotatably coupled to the locking unit.

2. The computing device of claim 1, further comprising a torsion spring through which the mounting pin extends, the torsion spring biasing the lever toward the second position.

3. The computing device of claim 2, wherein the torsion spring includes a first leg contacting the mounting ear and a second leg contacting the lever, the lever in the first position pressing the second leg toward the first leg to compress the torsion spring.

4. The computing device of claim 2, wherein in response to the lever being in the first position and the locking unit transitioning to the unlocked state, the torsion spring causes the lever to automatically move from the first position to the second position.

5. The computing device of claim 1, wherein the locking pin in the locked position extends into a locking pin aperture defined in the lever to secure the lever in the first position.

6. The computing device of claim 5, wherein in response to the lever being in the first position and the locking pin moving to the unlocked position, the locking pin retracts at least partially into the housing and out of the locking pin aperture of the lever to allow the lever to move to the second position.

7. The computing device of claim 6, wherein the baseplate is coupled to the mounting ear, the locking pin being mounted within a locking pin aperture of the baseplate such that the locking pin is axially movable within the locking pin aperture of the baseplate between the locked position and the unlocked position.

8. The computing device of claim 7, wherein the sliding member slides toward the locking pin to transition the locking unit from the locked state to the unlocked state.

9. The computing device of claim 7, wherein the locking pin extends through a hollow interior of the sliding member, and wherein the angled surface of the sliding member is disposed adjacent to the flared head of the locking pin.

10. The computing device of claim 6, wherein the locking unit includes a biasing spring through which the locking pin extends, the biasing spring biasing the locking pin toward the locked position.

11. The computing device of claim 6, wherein the lever includes an angled surface formed about a periphery of the locking pin aperture of the lever, and wherein in response to the lever moving from the second position to the first position, contact between the angled surface of the lever and the locking pin causes the locking pin to move to the unlocked position.

12. The computing device of claim 6, wherein the lever includes an angled surface formed about a periphery of the locking pin aperture of the lever, and wherein in response to the chassis being removed from the rack, contact between the angled surface of the lever and the locking pin causes the lever to rotate past the second position.

13. A computing system comprising:

a rack;

an attachment plate coupled to the rack; and a computing device including:

a chassis configured to hold one or more electronic devices, the chassis being insertable into the rack;

a mounting ear coupled to the chassis;

a lever rotatably coupled to the mounting ear, the lever being rotatable between a first position and a second position, the lever engaging the attachment plate when in the first position and disengaging the attachment plate when in the second position, the chassis being prevented from being removed from the rack when the lever is in the first position, the chassis being allowed to be removed from the rack when the lever is in the second position; and a locking unit coupled to and positioned above the mounting ear, the locking unit transitioning from a locked state to an unlocked state in response to a user force and automatically transitioning from the unlocked state to the locked state in response to the user force being removed, the lever being secured in the first position when the locking unit is in the locked state, the lever being movable from the first position to the second position when the locking unit is in the unlocked state, the locking unit including:

a housing including a window for internal accessibility, a locking pin having a flared head at one end, a mounting flange extending about a periphery of the locking pin, a sliding member that is slidably coupled to the locking pin, the locking pin passing completely through a hole of the sliding member, the flared head extending from one end of the sliding member, the locking pin extending from an opposite end of the sliding member, the sliding member having an angled surface that contacts the flared head of the locking pin when the locking unit transitions to the unlocked state, the flared head protruding through the sliding member, the contact between the angled surface and the flared head moving the locking pin from a locked position to an unlocked position, the sliding member further having an end that is accessible to a user through the window of the housing, contact of the user with the sliding member causing the sliding member to slide toward the flared head of the locking pin, and a baseplate mounted with the locking pin, the sliding member being slidably fixed between the locking pin and the baseplate, the baseplate being insertable and positioned between the sliding member and a bottom surface of the housing; and a mounting pin via which the lever is rotatably coupled to the mounting ear, the mounting pin extending through a first mounting pin aperture in the lever and into a second mounting pin aperture in the mounting ear, the lever being rotatable about the mounting pin between the first position and the second position, the mounting pin having a first end that extends into the second mounting pin aperture in the mounting ear, the mounting pin further having a second end that extends into a third mounting pin aperture of the locking unit such that the lever is further rotatably coupled to the locking unit.

14. The computing system of claim 13, wherein the lever includes a hook formed at an end thereof, the hook extending through an opening in the attachment plate when the lever is in the first position to prevent the chassis from being removed from the rack.

15. The computing system of claim 14, wherein the hook of the lever is removed from the opening in the attachment plate as the lever moves from the first position to the second position to allow the chassis to be removed from the rack.

16. The computing system of claim 14, wherein the lever further includes a stopping tab formed at the end of the lever adjacent to the hook, the stopping tab contacting the attachment plate as the lever moves away from the first position to prevent further movement of the lever and to define the second position of the lever.

* * * * *